United States Patent [19]

Torok et al.

[11] 4,282,585
[45] Aug. 4, 1981

[54] SITE OCCUPANCY DETECTOR

[75] Inventors: Steve F. Torok, Southampton; Vincent A. Formica, Holland; George P. Lange, Churchville, all of Pa.

[73] Assignee: The United States of America as represented by the Secretary of the Navy, Washington, D.C.

[21] Appl. No.: 408,970

[22] Filed: Oct. 25, 1973

[51] Int. Cl.³ .............................................. H04B 1/59
[52] U.S. Cl. ...................................... 367/2; 367/135
[58] Field of Search ............... 340/5 R, 15, 16 R, 161; 367/2, 6, 135, 136

[56] References Cited

U.S. PATENT DOCUMENTS

| 3,474,405 | 10/1969 | Padbero, Jr. | 367/2 |
| 3,564,493 | 2/1971 | Hicklin | 367/2 |
| 3,656,097 | 4/1972 | Massa | 367/135 |
| 3,686,658 | 8/1972 | Wilt | 367/136 |

Primary Examiner—Richard A. Farley
Attorney, Agent, or Firm—R. S. Sciascia; Henry Hansen

[57] ABSTRACT

An acoustic system for covertly detecting surface to air missile (SAM) sites by monitoring for noise emitted by the electrical power generated at the sites. The output of a microphone is sharply filtered around 75 Hz and a phase lock loop locks onto the signal and tracks slight deviations. By timing logic, signals of at least 7 minutes duration with interruptions of 10 seconds or less are considered SAM targets.

7 Claims, 3 Drawing Figures

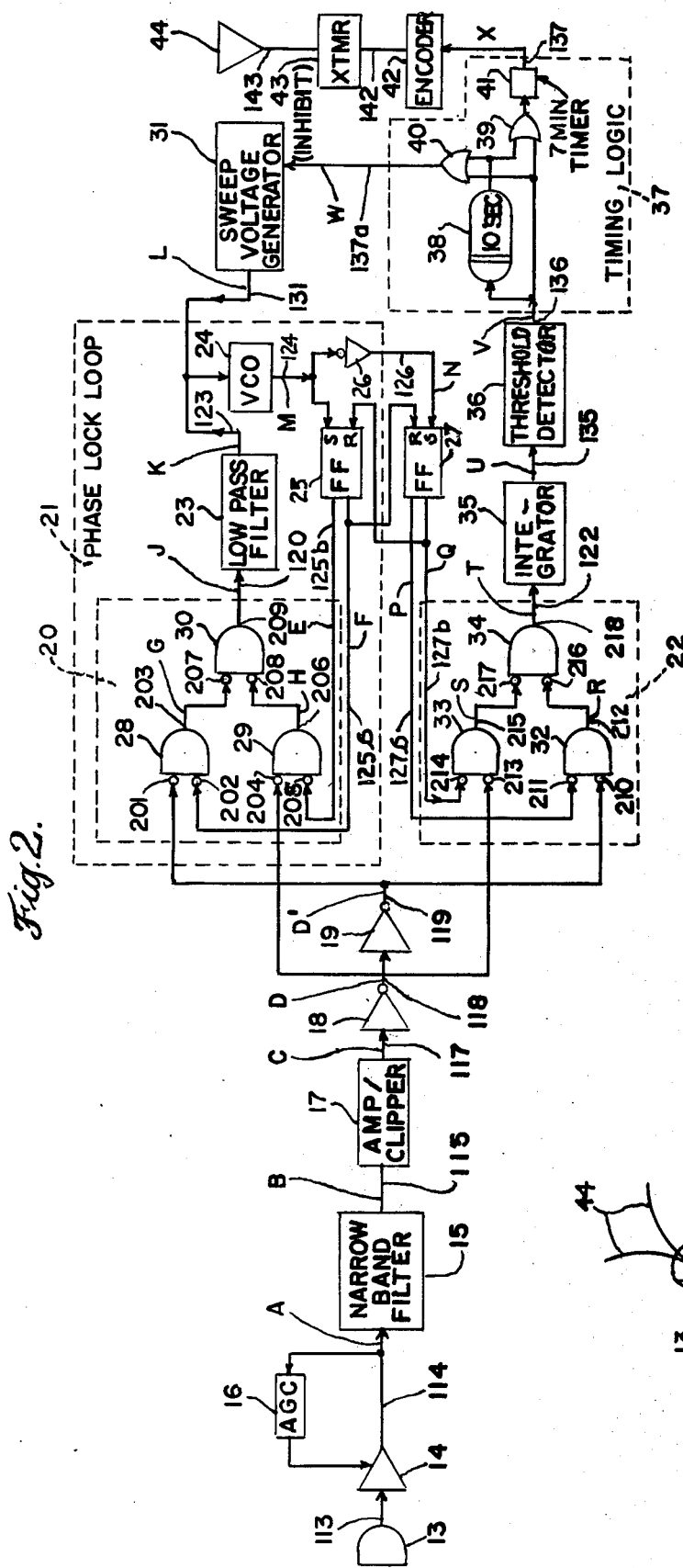

SITE OCCUPANCY DETECTOR

STATEMENT OF GOVERNMENT INTEREST

The invention described herein may be manufactured and used by or for the Government of the United States of America for governmental purposes without the payment of any royalties thereon or therefor.

BACKGROUND OF THE INVENTION

This invention relates generally to the field of sound locating devices and more particularly to a system for detecting and tracking an extremely narrow band of frequencies for a predetermined duration in accordance with specific timing logic.

Convert methods of detecting operating missile sites include the measurement of active radar RF activity when a missile is being launched or the measurement of acoustic energy emitted by the power generator required to run the site before an actual missile launch. The acoustic approach is deemed superior because it provides earlier warning of a potential missile launch, since the radar is used only during the missile flight itself, while the power generator is turned on for long periods of time prior to launch and is a good indicator that the site is occupied. In order to accurately determine the presence of such a site, it is necessary that an extremely narrow band of frequencies peculiar to the specific type of power generator used be selected for detection and tracking. Equally important is the timing logic including means to eliminate system lock-dropouts due to spurious ambient noise. The prior art does not reveal a combination of specific narrow band frequency tracking and particular timing logic in order to positively identify a target.

SUMMARY OF THE INVENTION

Accordingly, it is a general purpose and object of the present invention to provide a novel, accurate, reliable, compact, covert system for detecting and indicating the presence of a sound source within a specific narrow range of acoustic frequencies. It is a further object to provide an air acoustic system that can be used to covertly detect when a missile launch site becomes active by detecting and tracking the particular noise frequency emitted by the electrical generators at the site.

These and other objects are accomplished according to the present invention by a system comprising a microphone for sensing ambient acoustic information, a narrow band filter which accepts the microphone output and passes frequencies within a bandpass of 4 Hz about a center target frequency, signal processing means which accept the output from the filter, lock onto a target frequency and continuously track that frequency for a first predetermined duration and timing logic. If the signal processing means continue to track a target frequency line for the first predetermined duration without a single interruption lasting a second predetermined duration, as required by the timing logic, an output signal indicating a target is provided. If an interruption exceeding the second predetermined duration occurs, a signal is transmitted to a sweep generator for reactivating the signal processing means to reacquire a target signal.

BRIEF DESCRIPTION OF THE DRAWINGS

FIG. 1 is a perspective view of a frequency detector constructed according to the invention;

FIG. 2 is a block diagram shown partially in schematic form of one embodiment of the present invention.

DESCRIPTION OF THE PREFERRED EMBODIMENT

Figure 3:
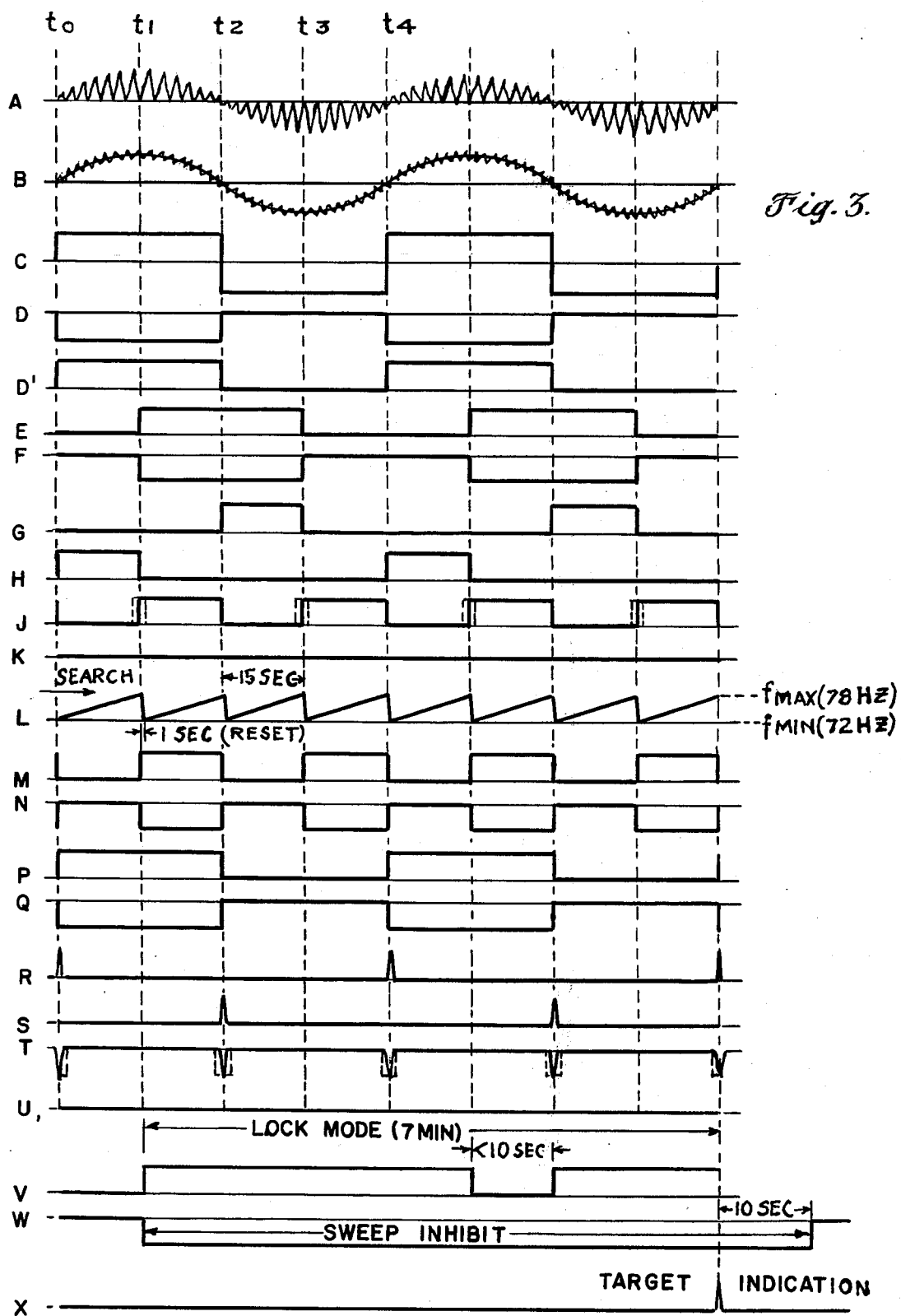
FIG. 3 is a timing diagram of typical waveforms associated with the system of FIG. 2.

FIG. 1 illustrates an embodiment of the present invention in which the frequency detection circuitry is housed in a canister 10, preferably cylindrical in shape, having a spike 11 at one end, an electronics system module 13 adjacent spike 11, a microphone 13 adjacent module 12 having a transmitter 43 housed therewithin and an antenna 44 extending from the top of canister 10. Canister 10 is designed to implant itself into the ground after deployment from an aircraft, generally within a one mile radius of the suspected target. The weight of canister 10 is distributed in such a manner that the tip of spike 11 falls forward and is sufficiently pointed to implant itself into terrain of widely varying hardness conditions. The system is capable of operating in a temperature range of 40° F. to 140° F.

Referring now to FIG. 2, microphone 13 is connected by a conductor 113 to a preamplifier 14 whose output is connected by a conductor 114 to a narrow band filter 15. An automatic gain control 16 is connected from the output of preamplifier 14 to another input thereto in a feedback loop to control the input signal level to filter 15. The center frequency ($F_o$) of filter 15 is 75 Hz with the frequencies at the −3 db power levels being 73 and 77 Hz respectively, and the slopes on either side being 18 db/octave. For a 75 Hz sine wave input voltage applied at the microphone terminals between the levels equivalent to 37 and 92 db with respect to $(0.0002$ microbars$)^2$, otherwise designated 37 db//$(0.0002$ ub$)^2$, and allowed to AGC stabilize, the total amplitude distortion at the output of filter 15 does not exceed 10 percent. The output from filter 15 is connected by a conductor 115 to an amplifier/clipper 17 which limits the filter output for the range of microphone input levels from 27-92 db//$(0.0002$ ub$)^2$. System noise at the filter output, when referred to the microphone terminal does not exceed the equivalent of a 75 Hz sine wave input of 27 db//$(0.000$ ub$)^2$. When a sine wave voltage between the limits of 73 and 77 Hz, whose amplitude is equivalent to a sound pressure level between 37 and 92 db//$(0.0002$ ub$)^2$, is introduced at the microphone terminals, amplifier/clipper 17 output is a square wave, whose amplitude does not vary more than ±1 db throughout the signal input range specified above. The deviation from a square wave does not exceed 4% of the half period for any signal input specified. Amplifier/clipper 17 is capable of recovering from a high amplitude signal overload, which is at least equivalent to the sound pressure level of 115 db//$(0.0002$ ub$)^2$ in the 73-77 Hz frequency range, within one minute after the overload is removed. The output from amplifier/clipper 17 is connected by a conductor 117 to an inverter 18 whose output is split, one portion being connected by a conductor 118 to an inverter 19, a second portion being connected to a phase detector 20 in a phase lock-loop 21, and a third portion being connected to a quadrature phase detector 22.

Phase lock loop 21 also includes a low pass filter 23 and a voltage controlled oscillator (VCO) 24 whose operation will be described in detail hereinafter. The output from inverter 19 is split, one portion being introduced via a conductor 119 into phase detector 20 and the other portion being introduced into quadrature phase detector 22. The output from phase detector 20 is connected by a conductor 120 to filter 23, and the output from filter 23 is coupled by a conductor 123 to a common input terminal of VCO 24. The output from VCO 24 is split, one portion being introduced via a conductor 124 into a set (S) terminal of a conventional flip-flop 25, and the other portion being connected to an inverter 26 via conductor 124. The output from inverter 26 is connected via a conductor 126 is a set (S) terminal of a conventional flip-flop 27. A first output from flip-flop 25 is introduced into a second (R) input to flip-flop 27, and a first output from flip-flop 27 is introduced into a second (R) input to flip-flop 25. The first and a second output from flip-flop 25 are introduced respectively via conductors 125a and 125b into phase detector 20. Similarly, the first and a second output from flip-flop 27 are introduced respectively via conductors 127a and 127b into phase detector 22.

Phase lock loop 21 will now be described in greater detail referring to FIG. 2 and FIG. 3. Phase detector 20 includes three "and" gates 28, 29 and 30 each having inverting inputs. Gate 28 receives a signal D' from inverter 19 at a terminal 201 and a signal F from flip-flop 25 at a terminal 202 yielding an output signal G at a terminal 203. Gate 29 receives a signal D from inverter 18 at a terminal 204 and a signal E from flip-flop 25 at a terminal 205 yielding an output signal H at a terminal 206. Gate 30 receives signal G at a terminal 207 and signal H at a terminal 208 yielding an output signal J from phase detector 20 at a terminal 209. Phase detector 20 thereby compares the frequencies of incoming acoustic signals D and D' with the respective frequencies of signals E and F from VCO 24 and indicates any phase difference therebetween. Signal J introduced into filter 23, which has a bandpass of 0-1 Hz and produces a closed second order active loop with a natural frequency of 2.5±0.5 radians per second, and a damping factor of 1.0±0.2 for the case of a noise-free 75 Hz input signal. VCO 24 receives a signal K from filter 23 only in a locked mode. In a search mode VCO 24 receives an output signal L sweeping within the frequency limits of 72-78 Hz from a sweep voltage generator 31 via a conductor 131. Generator 31 induces a periodic examination of the line of interest every 20 seconds. The frequency of VCO 24 does not drift more than 1 Hz during any 10 second period after the removal of a sinusoidal input signal in the frequency range between 73-77 Hz in the locked mode. VCO output signal M is characteristically approximately twice the frequency of incoming signal A to filter 15, and is divided in half in flip-flops 25 and 27 respectively before being reintroduced into detectors 20 and 22.

Detector 22 includes three "and" gates 32, 33 and 34 each having inverting inputs. Gate 32 receives input signal D' at a terminal 210 and an input signal P from flip-flop 27 at a terminal 211, yielding an output signal R at a terminal 212. Gate 31 receives input signal D at a terminal 213 and an input signal Q at a terminal 214, yielding output signal S at a terminal 215. Gate 34 receives input signal R at a terminal 216 and input signal S at a terminal 217 yielding an output signal T from detector 22 at a terminal 28. Signal T represents the maximum phase difference between incoming acoustic signals D and D' and respective inverted sginals P and Q from VCO 24. Signal T is introduced into an integrator 35 via a conductor 122, the output signal U therefrom being introduced into a threshold detector 36 via a conductor 135. The output signal V from detector 36 is introduced into timing logic 37 via a conductor 136. Signal V is split, one portion being introduced into a 10 second delay 38, and the other portion being introduced into or gates 39 and 40, both within timing logic 37. The output from delay 38 is connected to the other inputs to or gates 39 and 40. An output signal W from gate 40 is introduced into generator 31 via conductor 137a from logic 37 when phase lock-loop 21 is in the locked mode. Signal W inhibits generator 31 from emitting signal L. The output from gate 39 is introduced into a seven minute timer 41, which counts the duration of time phase lock loop 21 remains in the locked mode. Output signal Y from timer 41 after seven minutes in the locked mode is introduced into an encoder 42 via a conductor 137, the output from encoder 42 being introduced into a transmitter 43 via a conductor 142. Transmitter 43 emits a triggered RF code burst through antenna 44 via conductor 143, identifying the particular sensor and the fact that a target has been indicated.

The operation of the system will now be described with reference to FIG. 3, which illustrates typical wave shapes associated with the embodiment of FIG. 2 in the locked mode. Times "$T_o$" through "$T_4$" represent respectively 0°, 90°, 180°, 270°, and 360° phase shifts. Signal A is a representative amplified acoustic input signal which includes a wide range of frequencies from microphone 13 at the input to filter 15. Filter 15 rejects all frequencies outside of the range of 73 to 77 Hz, as illustrated by signal B. This essentially periodic signal is then amplified and clipped at appropriate positive and negative levels resulting in signal C out of amplifier-clipper 17. Signal C is then inverted and the negative polarity clipped in inverter 18, whose output signal D is split, one portion being introduced into inverter 19 and the other two portions being coupled to respective inputs of gates 29 and 33 in phase detectors 20 and 22 respectively. Signal D is then inverted in inverter 19 yielding signal D', 180° out of phase with signal D and coupled to respective inputs of gates 28 and 32 in phase detectors 20 and 22 respectively. In the search mode generator 31 emits signal L sweeping from 72-78 Hz with a ramp time of 15 seconds and a 1 second reset time. Signal L drives VCO 24 until a spectral target line is acquired by phase lock-loop 21 which locks onto the signal. In the locked mode generator 31 is effectively decoupled from the input to VCO 24 by inhibit signal W. When a target signal has been acquired, VCO 24 produces output signal M, which is a pulsed signal at approximately twice the frequency of the input acoustic signal A, or approximately 140-150 Hz. Signal M is split, one portion being coupled to an input of flip-flop 25 and the other portion being introduced into inverter 26, whose output signal N is shifted 180° out of phase with signal M and introduced into flip-flop 27. Flip-Flops 25 and 27 act as dividers, reducing the frequencies of their respective input signals M and N by one half and yielding respectively output signals E, F and P, Q. Signal F is introduced into the other input to flip-flop 27 and signal Q is introduced into the other input to flip-flop 25. Signal E is introduced into the other input to gate 29 while signal F is introduced into the other input to gate 28. Gates 28 and 29 have inverted inputs and the outputs therefrom, respectively G and H are coupled to inverted inputs to gate 30, whose output signal J is indicative of any phase shift (indicated by the dotted portions of signal J) between incoming signals D and D' and feedback signals E and F from VCO 24. Signals P and Q, which lead E and F respectively by 90°, are introduced into the other inputs to gates 32 and 33. Output signal R from gate 32 is an instantaneous pulse at time "$t_0$", or 0°, and output signal S from gate 33 is an instantaneous pulse at time "$t_2$", or 180°. Output signal T from gate 34 and thus phase detector 22 is a negative going pulse at 180°, indicative of any phase shift between input signals D and D' and signals P and Q from VC0 24.

Phase sensitive signal J is introduced into filter 23, having a bandpass of 0–1 Hz. Output signal K from filter 23 is an essentially constant DC voltage proportional to the phase error indicated by signal J. When there is no phase error, a zero D.C. voltage is produced, while a positive or negative D.C. voltage is produced by a leading or lagging phase shift. During the locked mode, signal K is fed into VCO 24 to modulate the frequency output therefrom and thus to constantly drive phase lock-loop 21 to seek phase agreement between incoming signals D and D' and the feedback signals E and F. Integrator 35 similarly receives phase sensitive signal T and produces an output signal U of an essentially constant D.C. voltage proportional to the phase error of signal T from phase detector 22. Signal T must be present in integrator 35 for a desired period of 1.36 seconds prior to generation of signal U therefrom. Locked mode is indicated when signal U exceeds the threshold level of detector 36, which then emits an output signal V to timing logic 37 indicative of target acquisition. A sweep inhibit signal W is generated by logic 37 as long as target acquisition is present, as indicated by phase lock-loop 21 remaining in the locked mode. Signal W inhibits the generation of sweep signal L from generator 31 until an interruption of duration greater than 10 seconds occurs or the system remains in the locked mode for a period of 7 minutes plus 10 seconds. At the expiration of 7 minutes logic 37 emits target indication signal X, which is merely a sharp pulse to encoder 42 signifying that a target has in fact been detected and instructing encoder 42 to actuate transmitter 43 to emit an encoded signal identifying the particular sensor and the fact that a target has been detected.

Having thus described the structure and operation of a preferred embodiment of the covert frequency detection apparatus, some of the many advantages of the present invention should now be readily apparent. The system is simple, reliable, economical and lends itself easily to modular design. The unique timing logic assures indication of a target with a high degree of confidence. The modular design feature is most desirable in that the sensor may be reconfigured easily for other applications, such as detection of other target frequencies by including another narrow band filter and phase lock-loop. Thus families of such modulus could be built to provide a selection of detectors for various applications.

Obviously, many modifications and variations of the present invention are possible in light of the above teachings. It is therefore to be understood that within the scope of the appended claims, the invention may be practiced otherwise than as specifically described.

What is claimed is:

1. A system for detecting and indicating an acoustic energy source comprising, in combination:
   detection means adapted to receive acoustic energy for providing a signal indicative thereof;
   first filter means operatively connected to said detection means for receiving the detection means signal and passing a signal within a predetermined frequency range indicative of the energy source;
   signal processing means operatively connected to receive the first filter means signal for acquiring and continuously tracking the filter means signal within the predetermined frequency range and producing a signal indicative of tracking;
   timing logic means connected to receive the signal processing means signal for selectively providing a first output signal indicative of the received signal for a first predetermined duration with interruptions not exceeding a second predetermined duration, and a second output signal indicative of an interruption in the received signal exceeding the second predetermined duration within the first predetermined duration, wherein said timing logic means includes,
   delay means connected to receive the signal processing means signal for providing a signal indicative thereof after the second predetermined duration;
   first and second gating means each having a first input connected to receive the delay means signal and a second input connected to receive the signal processing means signal, each providing a respective output signal when either of the input signals are present, the second gating means signal being the timing logic means second output signal; and
   timing means connected to receive the first gating means signal for providing an output signal after the first predetermined duration, the timing means output signal being the timing logic means first output signal.

2. A system as set forth in claim 1 wherein said signal processing means further comprises:
   generator means connected to receive the timing logic means second output signal for selectively producing a signal in the absence of the timing logic means second output signal;
   phase lock loop means having a first input operatively connected to receive the first filter means signal and a second input connected to receive the generator means signal for selectively acquiring the first filter means signal within the predetermined frequency range in the presence of the generator means signal and for tracking the first filter means signal within the predetermined frequency range in the absence of the generator means signal and producing a signal indicative thereof; and
   threshold means connected to receive the phase lock loop means signal for producing a signal when the phase lock loop means signal exceeds a predetermined level.

3. A system as set forth in claim 2 wherein said phase lock loop means further comprises:
   second filter means connected to receive a signal indicative of phase error for providing a signal having a level indicative of phase error;
   oscillator means having an input commonly connected to receive the signals from said second filter means and said generator means for producing a signal having a predetermined frequency indicative of the levels of the respective ones of the input signals; and first detecting means having a first input operatively connected to receive the first filter means signal and a second input operatively connected to receive the oscillator means signal for producing a signal indicative of the phase error between the frequencies of the respective ones of the input signals.

4. A system as set forth in claim 3 wherein said threshold means further comprises:

first inverting means connected to receive the oscillator means signal for producing an inverted signal thereof;

second detecting means having a first input operatively connected to receive the first filter means signal and a second input operatively connected to receive the first inverting means signal for producing a signal indicative of the phase error between the frequencies of the respective ones of the input signals;

integrating means connected to receive the second detecting means signal for providing an integrated signal over a fixed time having a level indicative of phase error; and third detecting means connected to receive the integrating means signal for producing a signal indicative of tracking when the integrating means signal exceeds a predetermined threshold, the third detecting means signal being the signal processing means signal.

5. A system as set forth in claim 4 wherein said phase lock loop means further comprises:

clipping means connected to receive the first filter means signal for limiting the positive going amplitude and negative going amplitude thereof at a predetermined level;

second inverting means connected to receive the clipping means signal for producing an inverted signal thereof; and third inverting means connected to receive the second inverting means signal for producing an inverted signal thereof.

6. A system as set forth in claim 5 wherein said first detecting means further comprises:

third gating means having a first inverting input terminal operatively connected to receive the oscillator means signal and a second inverting input terminal connected to receive the second inverting means signal for providing a signal when both input signals are present;

fourth gating means having a first inverting input terminal operatively connected to receive the oscillator means signal and a second inverting input terminal connected to receive the third inverting means signal for providing a signal when both input signals are present; and fifth gating means having a first inverting input terminal connected to receive the third gating means signal and a second inverting input terminal connected to receive the fourth gating means signal for providing a signal when both inputs are present, the fifth gating means signal being the first detecting means signal.

7. A system as set forth in claim 6 wherein said second detecting means further comprises:

sixth gating means having a first inverting input terminal operatively connected to receive the first inverting means signal and a second inverting input terminal connected to receive the second inverting means signal for providing a signal when both input signals are present;

seventh gating means having a first inverting input terminal operatively connected to receive the first inverting means signal and a second inverting input terminal connected to receive the third inverting means signal for providing a signal when both input signals are present; and eighth gating means having a first inverting input terminal connected to receive the sixth gating means signal and a second inverting input terminal connected to receive the seventh gating means signal for providing a signal when both inputs are present, said eighth gating means signal being the second detecting means signal.

* * * * *